(12) United States Patent
Klein

(10) Patent No.: US 10,638,236 B2
(45) Date of Patent: Apr. 28, 2020

(54) MEMS SOUND TRANSDUCER, MEMS MICROPHONE AND METHOD FOR PROVIDING A MEMS SOUND TRANSDUCER

(71) Applicant: Infineon Technologies AG, Neubiberg (DE)

(72) Inventor: Wolfgang Klein, Zorneding (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 16/000,260

(22) Filed: Jun. 5, 2018

(65) Prior Publication Data
US 2018/0352337 A1 Dec. 6, 2018

(30) Foreign Application Priority Data

Jun. 6, 2017 (DE) .................. 10 2017 209 495

(51) Int. Cl.
*H04R 19/00* (2006.01)
*H04R 19/01* (2006.01)
*H04R 19/04* (2006.01)
*H04R 23/00* (2006.01)
*H04R 31/00* (2006.01)
(Continued)

(52) U.S. Cl.
CPC ......... *H04R 19/005* (2013.01); *B81B 3/0021* (2013.01); *B81B 3/0051* (2013.01); *B81B 7/0016* (2013.01); *H04R 19/016* (2013.01); *H04R 19/04* (2013.01); *H04R 23/006* (2013.01); *H04R 31/00* (2013.01); *B81B 2201/0257* (2013.01); *B81B 2203/0127* (2013.01); *H04R 2201/003* (2013.01)

(58) Field of Classification Search
CPC ...... H04R 2201/003; H04R 7/04; H04R 7/06; H04R 7/16; B81B 3/0051; B81B 2201/0257
See application file for complete search history.

(56) References Cited

U.S. PATENT DOCUMENTS 9,319,798 B2 4/2016 Okugawa
2007/0154040 A1 7/2007 Chen
(Continued)

FOREIGN PATENT DOCUMENTS

DE 102014100722 A1 7/2014
DE 102015108918 A1 12/2015

*Primary Examiner* — Sunita Joshi
(74) *Attorney, Agent, or Firm* — Murphy, Bilak & Homiller, PLLC

(57) ABSTRACT

A MEMS sound transducer includes a backplate and a membrane held by an edge fixing such that the membrane is deflectable along a deflection direction toward the backplate. The MEMS sound transducer further includes an elevation element arranged between the membrane and the backplate and having a first height along the deflection direction. The MEMS sound transducer also includes a supporting structure and a spacer element arranged between the membrane and the supporting structure and having a second height along the deflection direction, the second height being greater than the first height. The supporting structure is the backplate or is a supporting element arranged opposite the backplate, such that the membrane is arranged between the backplate and the supporting element.

13 Claims, 10 Drawing Sheets

(51) Int. Cl.
*B81B 3/00* (2006.01)
*B81B 7/00* (2006.01)

(56) References Cited

U.S. PATENT DOCUMENTS

| | | | |
|---|---|---|---|
| 2008/0123876 A1* | 5/2008 | Sato | H04R 19/016 |
| | | | 381/174 |
| 2010/0065930 A1 | 3/2010 | Nakatani | |
| 2012/0148071 A1* | 6/2012 | Dehe | H04R 31/00 |
| | | | 381/116 |
| 2018/0262844 A1* | 9/2018 | Barzen | B81B 3/00 |

* cited by examiner

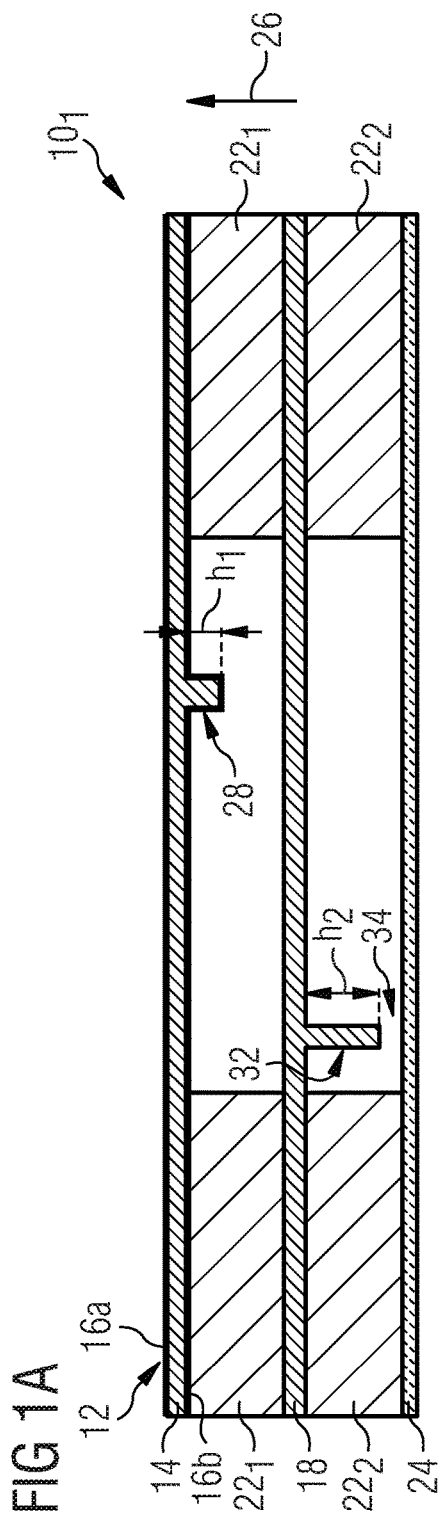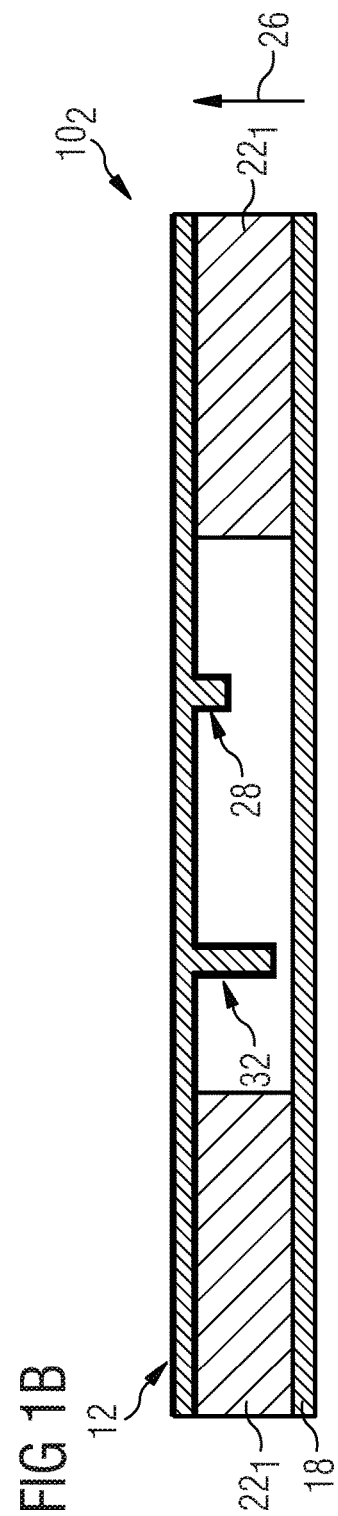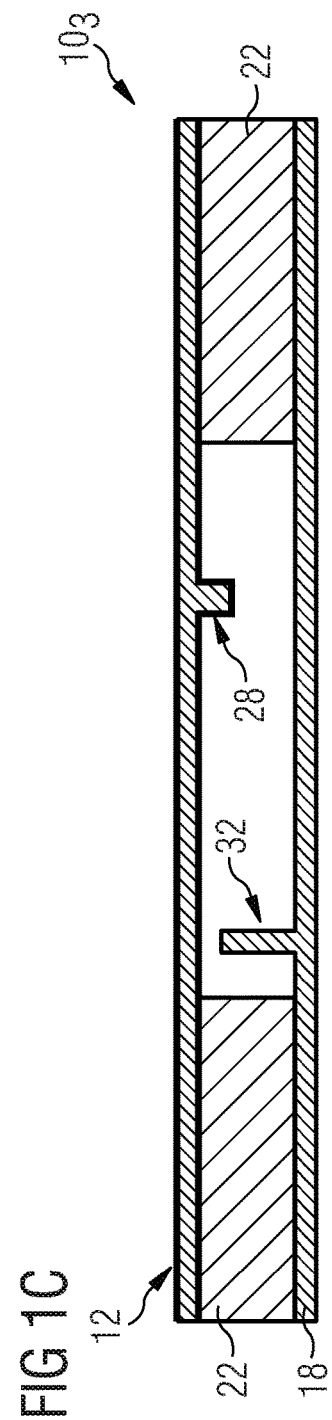

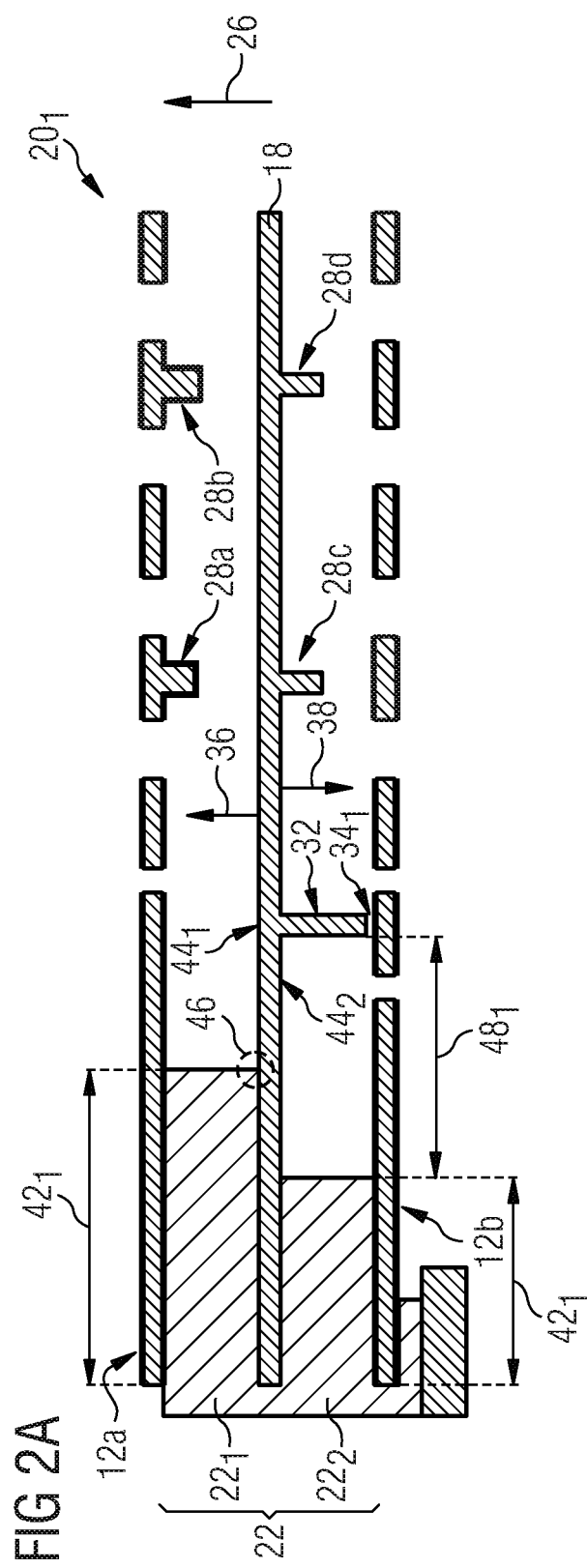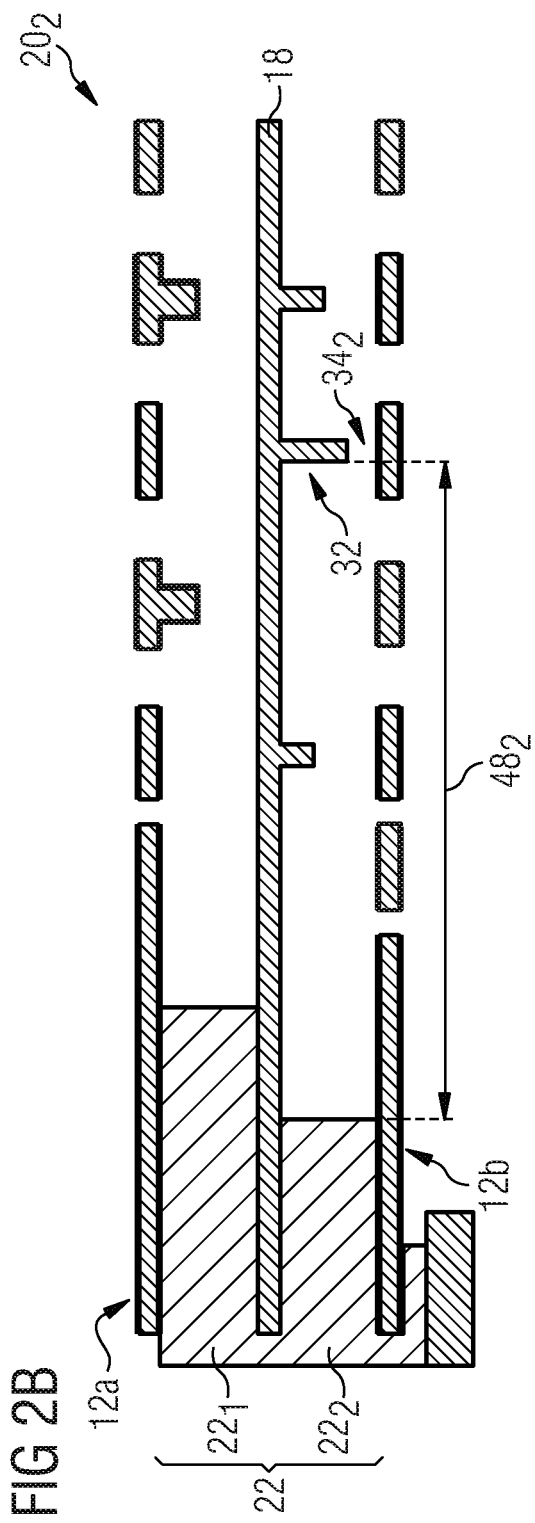

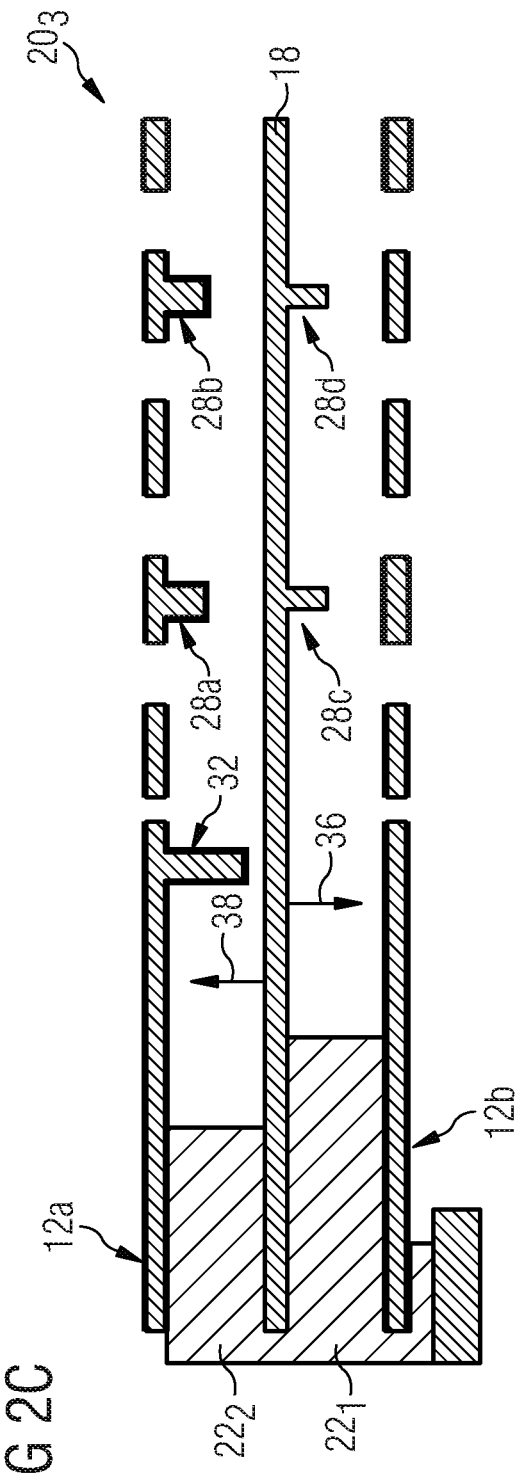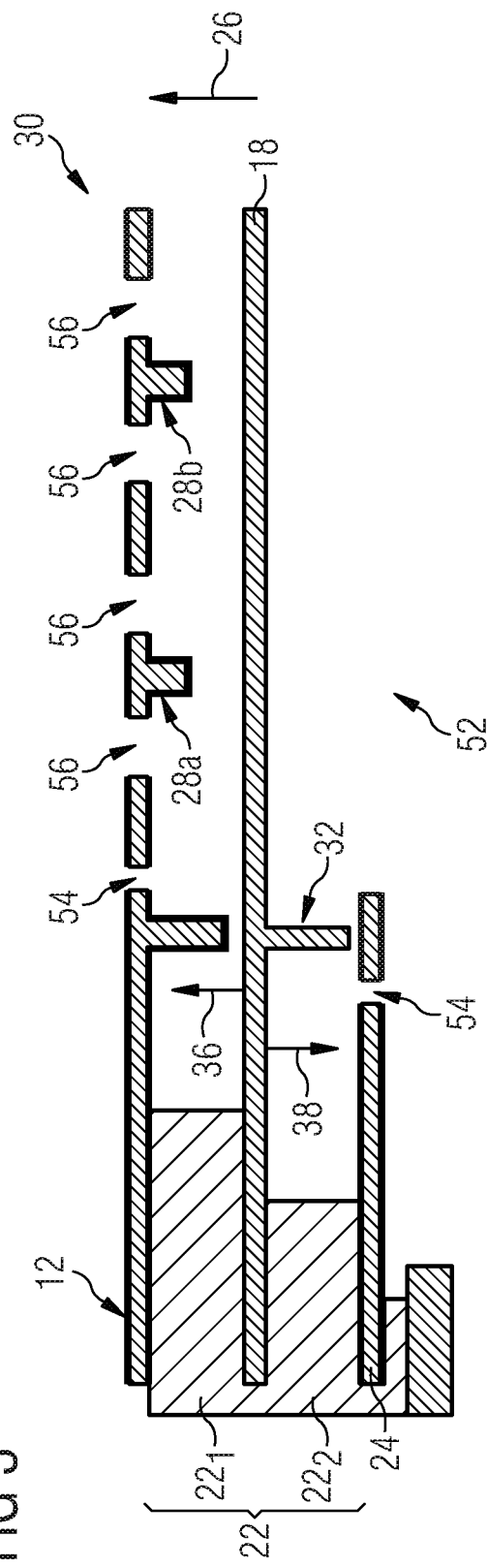

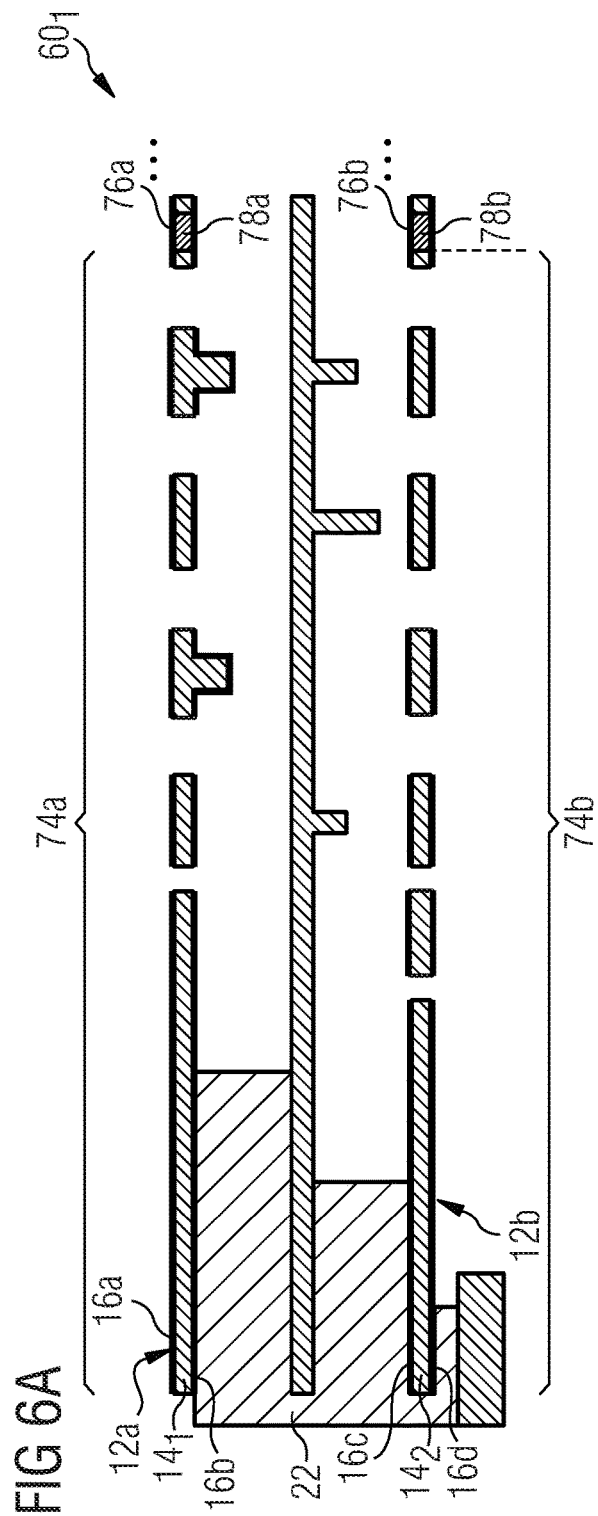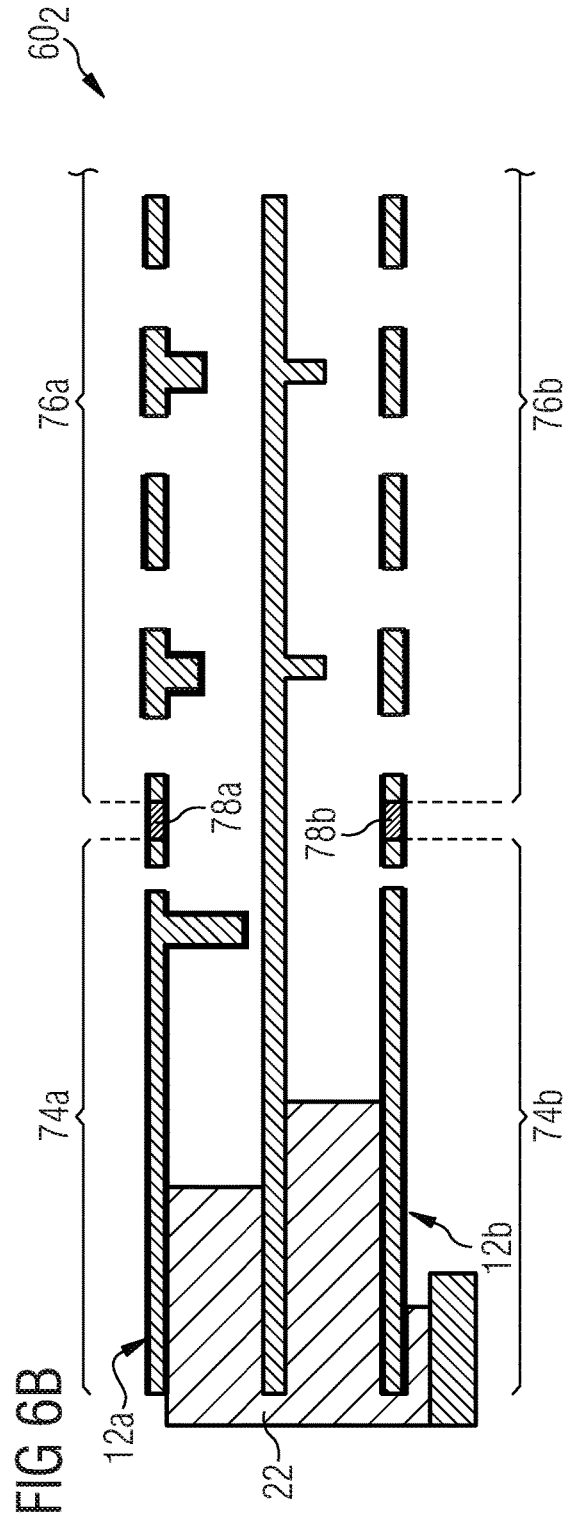

MEMS SOUND TRANSDUCER, MEMS MICROPHONE AND METHOD FOR PROVIDING A MEMS SOUND TRANSDUCER

TECHNICAL FIELD

The present disclosure relates to MEMS sound transducers, to a MEMS microphone and to a method for providing a MEMS sound transducer. The present disclosure furthermore relates to supporting structures in MEMS sound transducers.

BACKGROUND

Sound transducers, for instance microphones and/or loudspeakers, can be embodied as micromechanical systems (MEMS). Semiconductor materials can be used for this purpose, which makes it possible to produce the sound transducers as wafer-based sound transducers. Such sound transducers can comprise a movable electrode and at least one static electrode. The movable electrode can be embodied as a membrane designed opposite the static electrode.

MEMS sound transducers having a high robustness, in particular vis-à-vis mechanical loading, would be desirable.

SUMMARY

Exemplary embodiments provide a MEMS sound transducer comprising a backplate and a membrane held by an edge fixing such that the membrane is deflectable along a deflection direction toward the backplate. The MEMS sound transducer comprises an elevation element arranged between the membrane and the backplate and having a first height along the deflection direction. The MEMS sound transducer comprises a supporting structure and a spacer element arranged between the membrane and the supporting structure and having a second height along the deflection direction, said second height being greater than the first height. The supporting structure is the backplate itself, or is a supporting element arranged opposite the backplate, such that the membrane is arranged between the backplate and the supporting element. The spacer element enables a low mechanical loading of the membrane in the event of an overload of the MEMS sound transducer, such that the MEMS sound transducer is robust vis-à-vis the mechanical overload.

A further exemplary embodiment provides a MEMS microphone comprising a MEMS sound transducer in accordance with exemplary embodiments.

A further exemplary embodiment provides a method for providing a MEMS sound transducer. The method comprises arranging a backplate and arranging a membrane, such that the latter is held by an edge fixing such that the membrane is deflectable along a deflection direction toward the backplate. The method comprises arranging an elevation element between the membrane and the backplate, such that the elevation element has a first height along the deflection direction. The method comprises arranging a supporting structure and arranging a spacer element between the membrane and the supporting structure, such that the spacer element has a second height along the deflection direction, said second height being greater than the first height. The supporting structure is the backplate itself, or a supporting element arranged opposite the backplate, such that the membrane is arranged between the backplate and the supporting element.

Those skilled in the art will recognize additional features and advantages upon reading the following detailed description, and upon viewing the accompanying drawings.

BRIEF DESCRIPTION OF THE DRAWINGS

Exemplary embodiments are explained below with reference to the accompanying drawings, in which:

FIG. 1a shows a schematic lateral sectional view of a MEMS sound transducer in accordance with one exemplary embodiment;

FIG. 1b shows a schematic lateral sectional view of a MEMS sound transducer in accordance with a further exemplary embodiment, wherein a backplate shapes a supporting structure;

FIG. 1c shows a schematic lateral sectional view of a MEMS sound transducer in accordance with a further exemplary embodiment, wherein the supporting structure is the backplate and wherein a spacer element is arranged at a membrane;

FIG. 2a shows a schematic lateral sectional view of a MEMS sound transducer in accordance with a further exemplary embodiment, which MEMS sound transducer has a dual backplate configuration;

FIG. 2b shows a schematic lateral sectional view of a MEMS sound transducer in accordance with one exemplary embodiment, wherein a distance between the spacer element and the substrate is increased compared with FIG. 2a;

FIG. 2c shows a schematic lateral sectional view of a MEMS sound transducer in accordance with one exemplary embodiment, wherein a preferred direction of the MEMS sound transducer faces the backplate;

FIG. 3 shows a schematic lateral sectional view of a MEMS sound transducer in accordance with one exemplary embodiment, wherein the backplate and the membrane are spaced apart from one another by the substrate;

FIG. 6a shows a schematic plan view of a MEMS sound transducer in accordance with one exemplary embodiment, wherein a backplate has a segmentation;

FIG. 6b shows a schematic view of a further MEMS sound transducer in accordance with one exemplary embodiment, wherein the backplates have a segmentation;

DETAILED DESCRIPTION

Figure 4A:
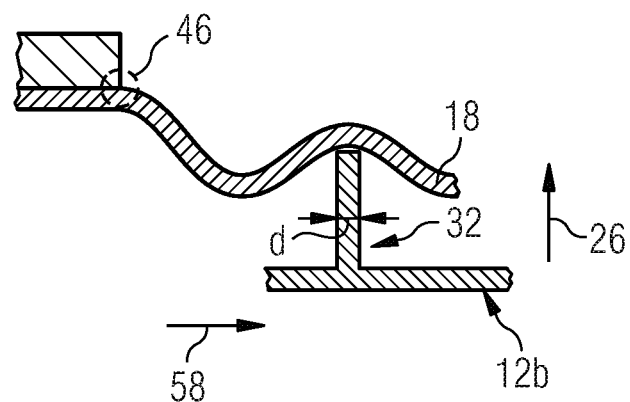
FIG. 4a shows a schematic lateral sectional view of an excerpt from a MEMS sound transducer in accordance with one exemplary embodiment, wherein the membrane is deformed around the spacer element arranged at the supporting structure.

Before exemplary embodiments are explained in more specific detail below with reference to the drawings, it is pointed out that identical, functionally identical or identically acting elements, objects and/or structures in the various figures are provided with the same reference signs, such that the description of these elements that is presented in various exemplary embodiments is mutually interchangeable or can be applied to one another.

Exemplary embodiments below relate to microelectromechanical structures (MEMS) which form or at least comprise a sound transducer. MEMS sound transducers can comprise loudspeakers and/or microphones, for example, which are configured to illicit a movement of a moveable element, i.e. a membrane, on the basis of an electrical drive signal, such that a fluid is moved by the movement of the membrane, such that a sound pressure level is generated in the fluid. By comparison with the loudspeaker configuration described above, in a microphone configuration a movement in the fluid can lead to a deflection of the membrane, which is detectable by a variable electrical potential and/or a variable electrical capacitance, such that an electrical signal can be obtained on the basis of the fluid movement.

MEMS sound transducers can be fabricated using semiconductor technology and/or comprise semiconductor materials. The latter include for example layers or wafers comprising a silicon material, a gallium arsenide material and/or some other semiconductor material. MEMS structures can comprise layer sequences comprising electrically conducting, electrically semiconducting and/or electrically poorly conducting or insulating layers in order to provide a corresponding MEMS functionality. In the exemplary embodiments described below, the backplate electrodes together with a deflectable membrane can form a stack, wherein the backplate electrode and the membrane are held for example via a substrate at respective edge regions. The substrate can be for example an amorphous, polycrystalline or crystalline semiconductor material, for instance silicon.

Membrane structures of MEMS sound transducers in accordance with exemplary embodiments can have a so-called full-clamped configuration, that is to say a full or almost full clamping, for instance if the membrane has a low flexural strength, but can also have a partial clamping, for instance if the membrane has a high flexural strength.

FIG. 1a shows a schematic lateral sectional view of a MEMS sound transducer 10$_1$ in accordance with one exemplary embodiment. The MEMS sound transducer 10$_1$ comprises a backplate 12. The backplate 12 can be an electrode structure, which can comprise an electrically conductive layer 14. The electrically conductive layer 14 can be partly or completely covered by an insulation layer 16a and/or 16b at one or more sides, in order to avoid an electrical short circuit upon a mechanical contact with other structures. The electrically conductive layer can comprise a metal material and/or a possibly doped semiconductor material. The insulation layers 16a and/or 16b can comprise or be formed from an electrically insulating material. The electrically insulating material can comprise for example an oxide material and/or a nitride material, for instance silicon oxide and/or silicon nitride.

The MEMS sound transducer 10$_1$ can comprise a membrane 18 spaced apart from the backplate 12 by a substrate material 22, for instance a semiconductor material such as silicon. The semiconductor material can be obtained for example using TEOS (tetraethyl orthosilicate).

The MEMS sound transducer 10$_1$ furthermore comprises a supporting element 24, which is configured to be non-movable or movable to a small extent relative to the membrane 18. The supporting element 24 can be connected to the substrate 22 and be spaced apart from the membrane 18 by the substrate 22.

The membrane 18 is held in an edge region by the substrate 22, i.e. by an edge fixing, such that the membrane 18 is deflectable along a deflection direction 26 toward the backplate 12. As was described above, the deflection along the deflection direction 26 can be effected on the basis of the contact with a fluid and/or on the basis of an electrical voltage between the membrane 18 and the backplate 12.

An elevation element (anti-sticking bump) 28 is arranged between the membrane 18 and the backplate 12. The elevation element 28 makes it possible, both during the fabrication of the MEMS sound transducer 10$_1$ and during the operation thereof, to prevent the membrane 18 from sticking to the backplate 12, for instance in the event of a high deflection of the membrane 18 as a result of high fluid pressures, as a result of high electrical voltages and/or as a result of other external forces. For this purpose, the elevation element 28 has a height or length $h_1$ indicating an extent of the elevation elements 28 parallel to the deflection direction 26. By way of example, the elevation element can be formed such that the height $h_1$ has a value in a range of at least 250 nm and at most 1300 nm, of at least 300 nm and at most 1000 nm, or of at least 600 nm and at most 900 nm, for instance exactly or within a tolerance range of ±10% a value of 850 nm. In a rest state of the des MEMS sound transducer 10, a distance between the membrane 18 and the elevation element 28 can have e.g. a value of at least 800 nm and at most 3200 nm, of at least 1000 nm and at most 3000 nm, or of at least 1500 nm and at most 2500 nm, for instance exactly or within a tolerance range of ±10% a value of 1800 nm. The elevation element 28 can also be arranged at the backplate 12 or be a part thereof. Alternatively or additionally, the elevation element 28 or a further elevation element can be arranged at the membrane and face in the direction of the backplate 12; that means that the elevation element can be arranged between the membrane 18 and the backplate 12, wherein fitting or contacting is possible at both elements.

The MEMS sound transducer 10$_1$ furthermore comprises a spacer element (support bump) 32 arranged between the membrane 18 and the supporting element 24. The spacer element 32 has a second height or length $h_2$ along the deflection direction 26. The height $h_2$ is higher than the height $h_1$ in terms of magnitude. The spacer element 32 can be formed such that the height $h_2$ comprises a value of at least 800 nm and at most 3000 nm, at least 1000 nm and at most 2200 nm, or of at least 1200 nm and at most 2400 nm, for instance exactly or within a tolerance range of ±10% a value of 1700 nm in the case of a spacer element arranged near an edge region of the membrane 18, or a lower value such as, for instance, exactly or within a tolerance range of ±10% a value of 1600 nm in the case of a spacer element arranged more centrally. For the comparison of the heights $h_1$ and $h_2$, the elements at which the elevation element 28 and the spacer element 32 are arranged and the directions along which the elements 28 and/or 32 extend proceeding from a respective fixing location may be unimportant. The comparison can be carried out on the basis of the extent in terms of magnitude parallel to the deflection direction 26, such that parallel to the deflection direction 26 $|h_1|<|h_2|$ can hold true.

The supporting element 24 can be arranged opposite the backplate 12, such that the membrane 18 is arranged between the backplate 12 and the supporting element 24.

A deflection of the membrane 18 in the direction of the supporting element 24 can then have the effect that a distance or gap 34 between the supporting element 24 and the membrane 18 is increasingly reduced, i.e. decreased, with increasing deflection of the membrane 18. This decrease can occur to an extent such that the spacer element 32 comes into mechanical contact with the supporting element 24. In this way, the spacer element 32 can reduce or even prevent a further-reaching deflection of the membrane 18 in the direction of the supporting element 24 at least locally at the location of the spacer element 32. That means that the spacer element 32 can restrict or limit a deflection of the membrane 18 in the direction of the supporting element 24. This makes it possible to reduce or prevent mechanical damage to the membrane 18 as a result of an excessively large deflection of the membrane 18 in the direction of the supporting element 24.

Although the spacer element 32 is illustrated such that it is a part of the membrane 18 and possibly a part of the electrode that is arranged in the membrane 18 or that is formed by the membrane 18, it is likewise possible to arrange the spacer element 32 at the supporting element 24, the spacer element 32 being arranged without change between the membrane 18 and the supporting element 24.

FIG. 1b shows a schematic lateral sectional view of a MEMS sound transducer $10_2$ in accordance with a further exemplary embodiment, wherein the backplate 12 shapes a supporting structure, at which the spacer element 32 is arranged. That means that the spacer element 32 can be arranged between the backplate 12 and the membrane 18 and be fixed to one of the two elements, for instance the backplate 12. The spacer element 32 is configured in this case to limit the deflection of the membrane 18 along the deflection direction 26 toward the backplate 12.

The MEMS sound transducers $10_1$ and $10_2$ have the commonality of a supporting structure. The supporting structure can be the supporting element 24 and/or can be the backplate 12.

FIG. 1c shows a schematic lateral sectional view of a MEMS sound transducer $10_3$, in accordance with a further exemplary embodiment, wherein the supporting structure is the backplate 12 and wherein the spacer element 32 is arranged at the membrane 18. Compared with the configuration of the MEMS sound transducer $10_2$, the arrangement of the elevation element 28 and of the spacer element 32 at different elements, i.e. the backplate 12 and the membrane 18, respectively, makes it possible that a shaping of elements having a different height $h_1$ or $h_2$ at the same element 12 or 18 can be avoided. By contrast, the configuration of the MEMS sound transducer $10_2$ can make it possible that during fabrication of MEMS sound transducers in a layer stack by depositing layers in an order from lower layers to upper layers, a formation of elevation elements and/or spacer elements such that they face toward the bottom can be effected comparatively simply since they can be obtained by producing trenches or holes and by filling the trenches or holes produced. Growth toward the top, as is illustrated by the spacer element 32 in FIG. 1c, for example, can entail a high fabrication outlay despite the possibilities afforded. It goes without saying that the terms used such as top or bottom and other orientations in space should be understood to be merely by way of example and are not intended to have any limiting effect. On the basis of an altered orientation of the structure in space, any other relative terms such as left, right, front or back can be used alternately and interchangeably with one another.

Although FIG. 1a to FIG. 1c show the presence of one spacer element 32, a higher number can also be arranged, for instance at least 2, at least 3 or at least 5 or higher. For instance a few 100 or in the region of 1000, while a number of the elevation elements 28 on the basis of a planar distribution can be higher by at least one order of magnitude. For a membrane having a for example round surface having a circumference of 1 mm, in the case of an arrangement in one row along the circumference with a spacing of 3 µm, a number of the spacer elements 32 can be a number of 1000 µm/3 µm≈333.

FIG. 2a shows a schematic lateral sectional view of a MEMS sound transducer $20_1$ in accordance with a further exemplary embodiment. The MEMS sound transducer $20_1$ can have a dual backplate configuration. By way of example, the membrane 18 can be arranged between two backplates 12a and 12b, which are non-movable or movable to a small extent relative to the membrane 18 and/or the substrate 22. For the sake of better illustration, the membrane 18 and also the backplates 12a and 12b in the illustration are connected to the substrate 22 only at one side. In a plan view, the membrane 18 can be connected to the substrate 22 for example by a circumferential edge fixing or in an edge fixing having only small interruptions. That means that FIG. 2a merely shows an incomplete excerpt from a complete lateral sectional view.

The MEMS sound transducer $20_1$ can have a preferred direction 36, along which the membrane 18 is deflectable preferably without damage, in particular compared with an opposite direction 38. By way of example, the MEMS sound transducer $20_1$ can be configured such that the preferred direction 36 faces toward the backplate 12a, while a deflection in the direction of a backplate 12b arranged opposite is less preferred. The spacer element 32 can be arranged along the opposite direction 38 proceeding from the membrane 18, that is to say between the backplate 12b and the membrane 18. As has already been explained above, the spacer element 32 can be arranged at the membrane 18 or at the backplate 12b.

The substrate 22 can be configured to hold the membrane 18 in an edge region of the membrane 18. In this case, a first edge region $42_1$ can be a region or an area of a first main side $44_1$ of the membrane 18, which is covered by a first substrate region or a first substrate layer $22_1$. A second main side $44_2$, opposite the first main side $44_1$, can be covered by a second substrate material or a second substrate layer $22_2$ in an edge region $22_2$ and thus be held by the substrate. The backplate 12b can serve as a supporting structure and be arranged in a manner facing the main side $44_2$. The spacer element 32 can be arranged near the edge region of the membrane 18, wherein this can mean an arrangement at the membrane 18 or the supporting structure.

One of the edge regions $42_1$ and $42_2$ can be smaller than the other edge region. By way of example, the edge region $42_2$ is smaller than the edge region $42_1$, such that the substrate $22_1$ forms an overhang with respect to the substrate $22_2$. Said overhang can be causally related to the preferred direction 36. If consideration is given to a region 46 which, in the projection of the substrate $22_1$, forms a boundary between the substrate 22 and a cavity of the MEMS sound transducer $20_1$, then a deflection of the membrane 18 along the preferred direction 36 can have the effect that the membrane 18 is bent around the substrate layer $22_1$ in the region 46. This can involve a comparatively noncritical loading of the membrane 18. Along the direction 38 opposite to the preferred direction 36, however, a deflection of the membrane 18 in the region 46 can lead comparatively rapidly to damage to the membrane 18. Such a deflection along the direction 38 can be reduced by the spacer element 32 at least to the extent to which damage would occur in the region 46. The region 46 can also be referred to as a so-called hotspot. The loading of, for example, 2 bar during compressed air cleaning along the opposite direction 38 can have an extremely local effect in the absence of the spacer element 32 and can lead to damage.

MEMS microphones can be subjected, along the preferred direction 36, for example, to pressures of up to several bar, for instance at least 5 bar, 6 bar or at least 7 bar, without damage. This may include cleaning of the MEMS sound transducer after fabrication, for example, which is implementable by means of compressed air. Although during normal operation then a MEMS sound transducer is subjected to or generates a few mbar, an overload situation can arise as a result of the compressed air, wherein it is desirable for the MEMS sound transducer to withstand such a situation without damage. Alternatively or additionally, a mechanical overload situation can be obtained during so-called drop tests, for example, wherein the membrane 18 is likewise deflected relative to the backplates 12a and/or 12b. The relatively soft membrane can be a weak point of the MEMS sound transducer in such tests, particularly if it is deflected counter to the preferred direction 36, i.e. along the direction 38.

By comparison with anti-sticking bumps 28a-28d distributed in a planer fashion and provided in order to prevent the membrane from mechanically or electrostatically sticking to a backplate, the spacer element 32 can be provided in order to prevent a corresponding deflection of the membrane 18 in the case of the occurrence of an overload situation in mechanical contact with the supporting structure, for instance the backplate 12b. In a rest state of the MEMS sound transducer $20_1$, a gap $34_1$ can have a value that makes it possible to substantially avoid contact between the spacer element and the other structure during regular operation of the MEMS sound transducer. In the event of an overdriving or overload, the contact can be effected in order to avoid damage. By way of example, at an acoustic overload point, i.e. in the case of an overdriving, a contact between the spacer element 32 and the supporting structure can indeed be effected. This enables a sound pressure level of 120 dB to 130 dB, for example, regardless of the mechanical contact. By way of example, the gap or distance $34_1$ can have a value in a range of at least 20 nm and at most 300 nm, at least 30 nm and at most 200 nm, or of at least 50 nm and at most 150 nm, for instance approximately 100 nm.

As a result of the fixing of the membrane 18 in the edge regions $42_1$ and $42_2$, an amplitude of the deflection of the membrane 18 can be comparatively larger in a central region of the membrane 18 compared with adjacent to the edge regions $42_1$ and $42_2$. In order to avoid the overload situation described, the spacer element 32 can be arranged adjacent to the edge region $42_2$, i.e. at a distance $48_1$ from the substrate. The distance $48_1$ can have an arbitrary value. In accordance with exemplary embodiments, the distance $48_1$ has a value of at least 1 μm and at most 70 μm, at least 2 μm and at most 50 μm, or of at least 5 μm and at most 40 μm, for instance exactly or within a tolerance range of ±10% a value of 20 μm.

FIG. 2b shows a schematic lateral sectional view of a MEMS sound transducer $20_2$, wherein a distance $48_2$ is increased compared with the distance $48_1$ from FIG. 2a, that is to say that the spacer element 32 can be arranged more centrally compared with FIG. 2a. The distance $48_2$ can have e.g. a value of at least 2 μm and at most 80 μm, at least 5 μm and at most 70 μm, or of at least 10 μm and at most 50 μm, for instance exactly or within a tolerance range of ±10% a value of 30 μm. In return, a gap $34_2$ is increased compared with the gap $34_1$. As a result of the increasing distance $48_2$ from the substrate 22, the deflection of the membrane 18 can be larger at the location of the spacer element 32. A comparatively small distance, for instance the distance $48_1$, makes it possible that a small influence on the dynamic characteristics of the membrane 18 can be obtained. This can mean that the support bump does not influence operation, or scarcely influences operation, and merely provides overload protection, for instance in the case of excess pressure. The spacer element 32 can be configured to come into mechanical contact with the supporting structure only in the case of an overload, which in association with the large deflection of the membrane 18 at the location of the spacer element 32 can lead to an increased distance between the spacer element 32 and the supporting structure compared with FIG. 2a. In the rest state of the MEMS sound transducer $20_2$, the distance or gap $34_2$ can have a value of, for example, at least 20 nm and at most 300 nm, at least 50 nm and at most 250 nm, or at least 100 nm and at most 230 nm, for instance 200 nm. The gap $34_2$ can be larger than the gap $34_1$. The rest state can refer to a state in which no forces generated artificially are present for deflecting the membrane 18. It goes without saying that e.g. gravitational forces or the like are always present.

A difference between the edge fixings or edge regions $42_1$ and $42_2$, i.e. an overhang can be for example in a range of 3 to 5 μm, such that here the edge fixing $42_1$ can have an overhang of 3 to 5 μm relative to the edge fixing $42_2$, wherein other values can also be arranged here.

FIG. 2c shows a schematic lateral sectional view of a MEMS sound transducer $20_3$, wherein the preferred direction 36 faces the backplate 12b. The spacer element 32 is arranged between the backplate 12a and the membrane 18. Proceeding from the membrane 18 the spacer element 32 is arranged e.g. along the direction 38. The spacer element 32 can be arranged at the backplate 12a and face the membrane 18. In accordance with the explanations concerning FIGS. 2a and 2b, the spacer element 32 can also be arranged at the membrane 18 and face the backplate 12a.

The MEMS sound transducers $20_1$, $20_2$ and $20_3$ can each comprise 1, 2 or a plurality of elevation elements 28a-b between the backplate 12a and the membrane 18 in order to reduce or to prevent sticking of the membrane 18 to the backplate 12a. In a similar manner, a number of at least one, of at least two or a plurality of elevation elements 28c-d can be arranged between the membrane 18 and the backplate 12b.

FIG. 3 shows a schematic lateral sectional view of a MEMS sound transducer 30 in accordance with one exemplary embodiment. The MEMS sound transducer 30 comprises the backplate 12 and the membrane 18, which are spaced apart from one another by the layer $22_1$ of the substrate 22. A layer thickness of the layer $22_1$ and/or $22_2$ can be e.g. in a range of between at least 0.2 µm and at most 10 µm, between at least 0.5 µm and at most 5 µm, or of at least 1 µm and at most 3 µm, for instance approximately 2 µm, and e.g. 1.8 µm. The MEMS sound transducer 30 comprises the supporting element 24, which is formed in a ring-shaped fashion, for example, such that adjacent to the edge region of the membrane 18, the supporting element 24 is arranged such that the spacer element 32 can come into mechanical contact with the supporting element 24 in the case of an overload. The supporting element 24 can be absent in a central region 52, which enables material savings. The supporting element 24 can comprise a structure that is similar to the backplate 12 in order to effect simple production and/or production of the spacer element 32 whilst avoiding complex rearrangements of production processes.

The supporting element 24 and/or the backplate 12 can have etch holes (release holes), through which the substrate 22 is removable during an etching process. Furthermore, the backplate 12 can have openings 56 enabling a movement of fluid to the membrane 18 or passing away from the membrane 18 through a plane of the backplate 12.

FIG. 4*a* shows a schematic lateral sectional view of an excerpt from a MEMS sound transducer. This shows the backplate 12*b*, at which the spacer element 32 is arranged in a manner facing the membrane 18. In the case of an overload as discussed, the membrane 18 can come into mechanical contact with the spacer element 32. As has already been described, the membrane 18 is configured in a soft fashion compared with the supporting structure. This enables the membrane 18 to deform around the spacer element 32, such that a mechanical load is taken up by the spacer element 32 as a result of the deformation, whereby a mechanical loading of the membrane 18 in a region of the substrate suspension is reduced compared with an absence of the spacer element 32. The region in which the mechanical loading is reduced can be the region 46. The reduced mechanical loading can also be understood such that the mechanical loading is kept below a damage-initiating extent. If e.g. silicon is used as membrane material, a tensile stress of less than or equal to approximately 1 GPa can be taken up without incurring damage. If silicon nitride is used, which is likewise a suitable membrane material, at least as an insulation layer, a tensile stress in a range of 1 to 2 GPa can be taken up.

Figure 4B:
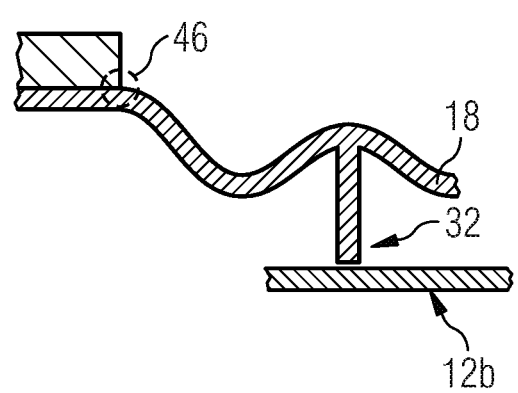
FIG. 4b shows a schematic lateral sectional view of a different configuration in comparison with FIG. 4a in accordance with one exemplary embodiment, in which configuration the spacer element is arranged at the membrane.

FIG. 4*b* shows a schematic lateral sectional view of a different configuration in comparison with FIG. 4*a*, in which configuration the spacer element 32 is arranged at the membrane 18. Here, too, the membrane 18 can be deformed around the spacer element 32 in the case of the overload, such that the loading is reduced in the region 46.

The spacer element can have a dimension d along a direction 58 perpendicular to the deflection direction 26, which dimension is at least 0.5 µm and at most 1.5 µm, at least 0.6 µm and at most 1.4 µm, or at least 0.8 µm and at most 1.2 µm. The dimension d can be a diameter, for example, if the spacer element 32 is embodied as round. Alternatively, an edge length of a polygon can be involved if the spacer element 32 is formed as a polygon. The dimension d can be arranged for example parallel to a direction of extent of the backplate 12*b*.

Figure 4C:
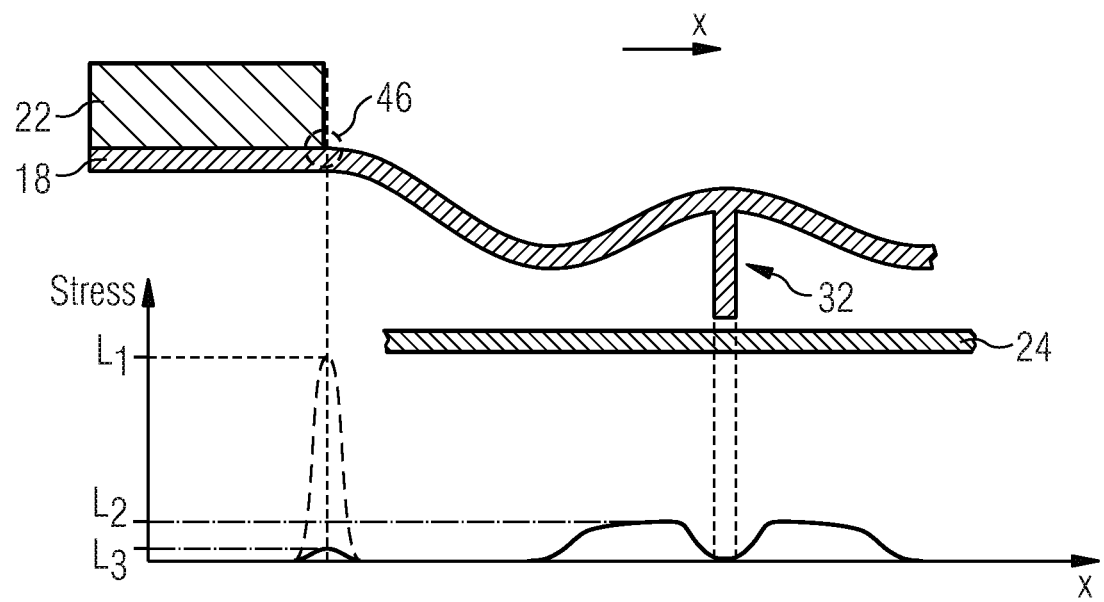
FIG. 4c shows a schematic view of a stress distribution versus a location in the membrane in accordance with one exemplary embodiment.

FIG. 4*c* shows a schematic view of a stress distribution versus a location x in the membrane 18, said location indicating different positions proceeding from the substrate 22 in the direction of a center of the membrane 18. A distribution which can be obtained if absence of the spacer element 32 prevails is illustrated in a dashed manner. The deflection of the membrane 18 can give rise to a comparatively high loading with a level $L_1$, which can lead to damage to the membrane 18. As a result of the arrangement of the spacer element 32, the mechanical stress is distributed over a comparatively large region of the spacer element 32, such that a low loading with a level $L_3$ arises at the location of the region 46. The mechanical stress, at least with regard to its integral, is largely shifted to the location of the spacer element 32, wherein the membrane 18 here is able to deform around the spacer element 32, such that the stress can be distributed over a comparatively large region, the level $L_2$ of which can be so low that damage to the membrane 18 fails to occur even in the case of an overload. As a result, it is possible, for example, to achieve a loading capacity of the MEMS sound transducer of from 2 bar up to a loading capacity of 4 bar, 5 bar, 6 bar or higher until the membrane 18 incurs damage. During normal operation of the MEMS sound transducer, the spacer elements 32 can remain functionless. In the case of an overload, however, they can take up the surge forces.

Figure 5A:
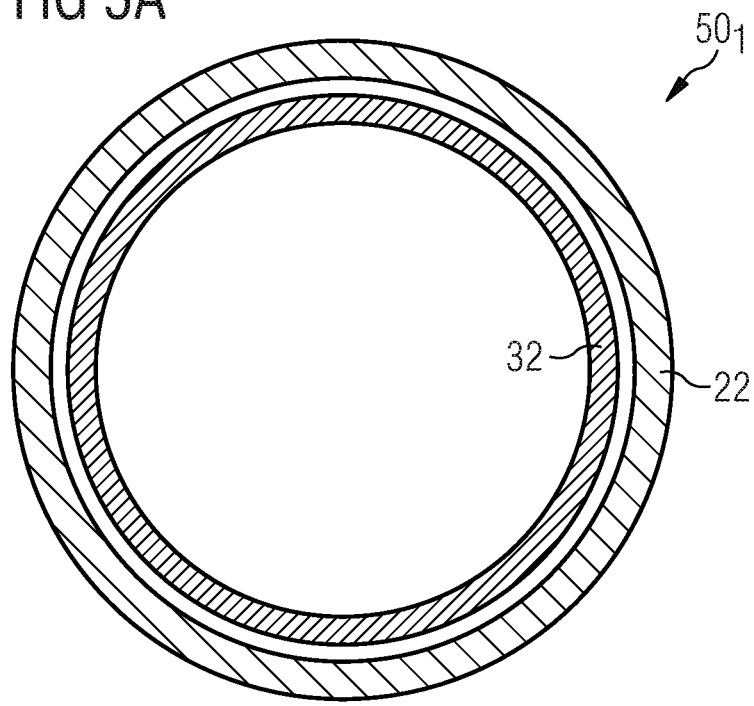
FIG. 5a shows a schematic plan view of parts of a MEMS transducer in accordance with one exemplary embodiment, wherein the substrate is configured in a round fashion.

FIG. 5*a* shows a schematic plan view of parts of a MEMS transducer $50_1$, wherein the substrate 22 is configured in a round fashion, for example, in order to hold the membrane in an edge region extending in a round fashion. Without more extensive restrictions, the substrate 22 can also be of any other shape, for instance polygon-shaped or freeform-shaped. The spacer element 32 can likewise be formed as a round ring and be arranged at the membrane (not illustrated) or the supporting structure. The configuration of the spacer element 32 as a circumferential ring enables a uniform reduction of the stress in the membrane.

Figure 5B:
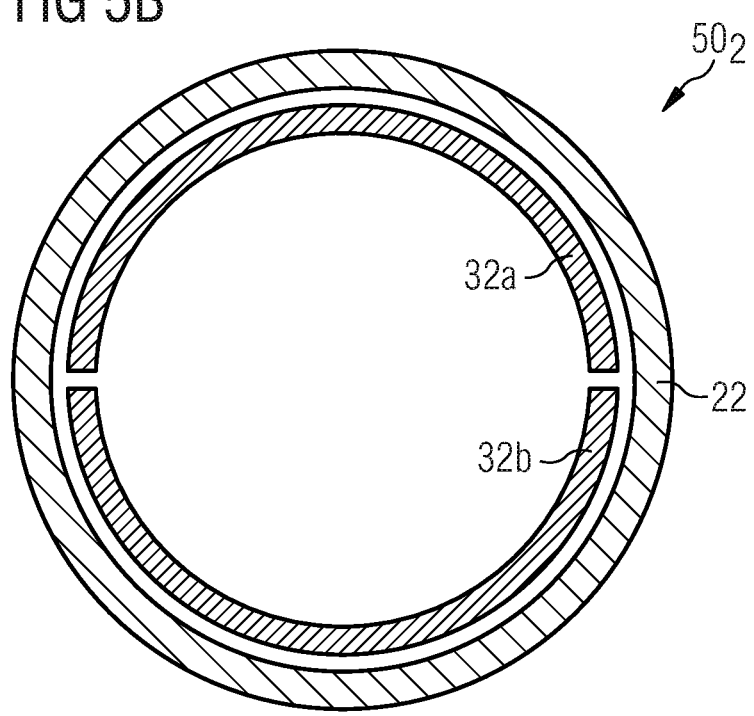
FIG. 5b shows a schematic plan view of parts of a MEMS sound transducer in accordance with a further exemplary embodiment, which MEMS sound transducer comprises two spacer elements.

FIG. 5*b* shows a schematic plan view of parts of a MEMS sound transducer $50_2$ in accordance with a further exemplary embodiment, which MEMS sound transducer comprises two spacer elements 32*a* and 32*b*. The spacer elements 32*a* and 32*b* can each correspond approximately to a half-ring. Alternatively, by way of example, the ring from FIG. 5*a* can be subdivided into as many elements as desired.

Figure 5C:
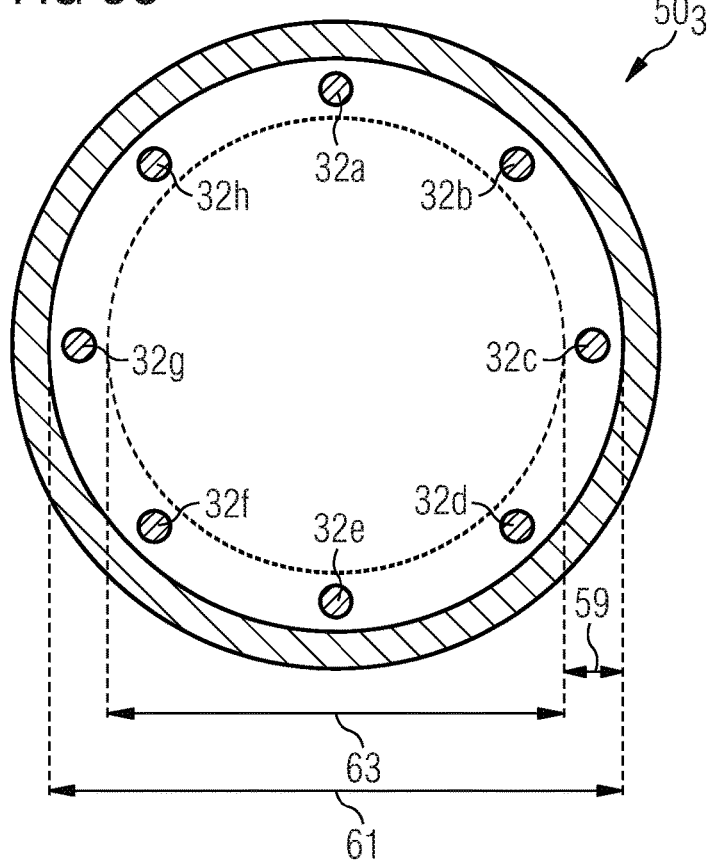
FIG. 5c shows a schematic plan view of parts of a MEMS sound transducer in accordance with one exemplary embodiment, wherein a multiplicity of spacer elements are arranged, which are distributed over the edge region of the membrane.

FIG. 5*c* shows a schematic plan view of parts of a MEMS sound transducer $50_3$, wherein a multiplicity of spacer elements 32*a* to 32*h* are arranged, which are distributed over the edge region of the membrane. Although the spacer elements 32*a* to 32*h* are illustrated such that they are each at the same distance from the substrate 22, the spacer elements 32 can also be at different distances from one another.

The membrane can have an oval or even round surface. Alternatively, the membrane can also be formed as a polygon or freeform surface. The MEMS sound transducer 50 can comprise a high number of anti-sticking bumps, for instance at least 20, at least 50 or at least 100, which can be distributed in a planar fashion at the membrane. The anti-sticking bumps are different from the at least one support bump. The spacer element 32 can follow a contour of the membrane 18 and have a likewise oval or even round shape in the example of the MEMS sound transducer 50. Alternatively, it is likewise possible for the spacer element 32 to have interruptions along the circumferential line.

The spacer elements 32*a*-*h* can be arranged in an outer region 59 of the membrane 18 or the oscillatory region thereof. The outer region 59 can be a proportion of at most 20%, at most 15% or at most 10% of a reference total dimension 61. The reference total dimension 61 can be a diameter in the case of a round membrane 18, and an edge length in the case of a polygonal, for instance square, shape.

That means that the distance $48_1$ and/or $48_2$ can be at most 20%, at most 15% or at most 10% of the reference dimension of the oscillatory region of the membrane 18, wherein a total area of the outer region 59 and of an inner region 63 can yield the oscillatory area.

Figure 5D:
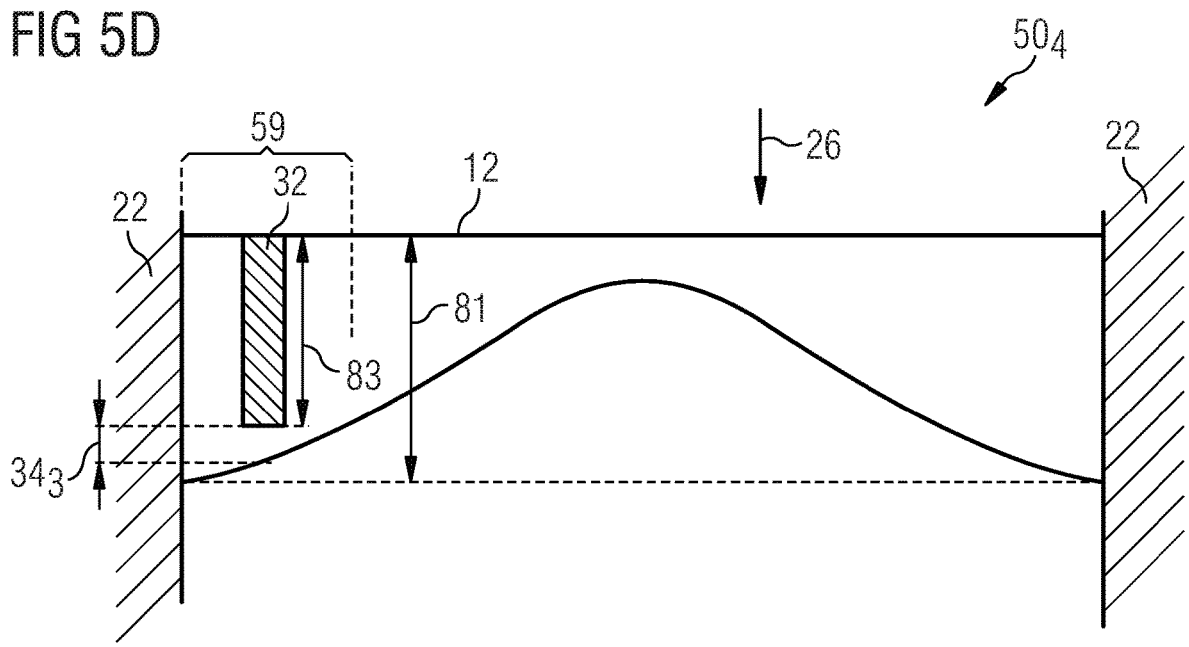
FIG. 5d shows a schematic perspective view of a MEMS sound transducer in accordance with one exemplary embodiment, which MEMS sound transducer can be formed in the absence of the spacer elements.

FIG. 5d shoes a schematic perspective view of a MEMS sound transducer $50_4$, which can be formed in the absence of the spacer elements 28, wherein the explanations below, without restrictions, are also applicable to other MEMS sound transducers in accordance with exemplary embodiments. As has already been explained, the membrane can be deflectable along one or both directions 26. The spacer element 32 can be arranged between the backplate 12 and the membrane 18 and/or between the membrane 18 and a supporting element.

MEMS sound transducers can be designed for disturbance-free normal operation. The latter can be determined e.g. by the membrane 18 not striking the backplate or the supporting structure during said operation, in order to avoid harmonic distortion. Harmonic distortion may denote the effect that no additional deflection takes place despite stronger force on the membrane, which in the sound generating mode can lead e.g. to clipping/harmonic distortion in the reproduced sound. This effect can also readily occur in sensor-based operation. Alternatively or additionally, disturbance-free normal operation can be an operating mode in which there is damage to the device as a result of operation wherein the design parameters for a continuous application, that is to say that the device is not subjected to excessive stress.

The MEMS sound transducer $50_4$ can be formed such that the supporting structure is at a distance 81 from the membrane during the rest position of the MEMS sound transducer. The spacer element 32 can be arranged between the membrane 18 and the supporting structure. The spacer element 32 can be arranged in the outer region 59 of the membrane 18. The spacer element 32 can have a height 83 along the deflection direction 26, such that, at the location of the spacer element 32 and in the rest position, the gap 34 between the membrane 18 and the spacer element 32 is at most 20%, at most 15% or at most 10% of the distance 81 between the supporting structure and the membrane 18.

Alternatively or additionally, the height 83 in the rest position can be greater than a membrane-global minimum distance between the membrane 18 and the supporting structure during disturbance-free operation of the MEMS sound transducer, that is to say while the membrane is deflected. In this case, membrane-global means deflection over the entire extent of the membrane 18.

Alternatively or additionally, during disturbance-free operation of the MEMS sound transducer, the supporting element 24 can be at a distance of at most 20 nm, at most 15 nm or at most 10 nm from the membrane, that is to say that the gap 34 can decrease to at most 20 nm, at most 15 nm or at most 10 nm and, during normal operation, is at least 1 nm, at least 3 nm or at least 5 nm.

Alternatively or additionally, the height 83 can be configured such that, during disturbance-free operation, the gap 34 is larger than the deflection of the membrane 18 along the deflection direction 26 at the location of the spacer element 32.

As already explained, these features can also be included for the other MEMS sound transducers in accordance with exemplary embodiments. Alternatively or additionally, the MEMS sound transducer $50_4$ can also have some or a plurality of features of the other MEMS sound transducers, specifically in any desired combination. Compared with the explanations given e.g. in association with FIG. 2a, 2b or 3, a layer thickness of the substrate layers $22_1$ and $22_2$ can also be different from one another and/or the supporting element 24 can also be arranged nearer to the membrane than the backplate 12, without this having a limiting effect on the functioning of the spacer elements described herein. Moreover, the spacer element 32 can be arranged independently of anti-sticking bumps, wherein the functioning of the spacer element differs vis-à-vis such elements—then possibly absent—in that the spacer element or the spacer elements can be configured, in the case of an overload to prevent mechanical damage to the membrane, in particular as a result of detachment effects from the substrate layer, and/or to reduce a corresponding force action on the membrane by at least 70%, at least 80% or at least 90%, which can be obtained e.g. by an arrangement in the outer region of the membrane and a sufficiently long length of the spacer element.

FIG. 6a shows a schematic view of a MEMS sound transducer $60_1$, wherein, in comparison with the MEMS sound transducer $20_2$ the backplates 12a and/or 12b or the electrically conductive layers $14_1$ and $14_2$ of the backplates 12a and 12b ca be segmented, such that a first region 74a of the backplate 12a is electrically insulated from a second region 76a of the backplate 12a by an insulation region 78a and/or such that a first region 74b of the backplate 12b is electrically insulated from a second region 76b of the backplate 12b by an insulation region 78b. Mutually different electrical potentials can be applied to the regions 74a and 76a and the regions 74b and 76b. A material that is arranged in the insulation regions 78a and/or 78b can be the material of the layers 16a-d and/or some other electrically insulating material.

The regions 76a and 76b can be arranged e.g. parallel to a central region of the membrane 18. That is to say that the electrically conductive material $14_1$ and/or $14_2$ can have a segmentation, such that a center region of the backplates 12a and/or 12b is electrically isolated from an edge region of the membrane. Alternatively, the backplate can be segmented in any other way, for instance into at least two laterally adjacent area pieces, for instance area halves, area thirds or the like separated by a diagonal. It is furthermore possible for segmented area pieces to have a mutually different basic area or size. The segmentation enables a backplate capacitance to be divided into a plurality of partial capacitances that are electrically connected in series with one another, such that a total capacitance is comparatively low.

FIG. 6b shows a schematic view of a MEMS sound transducer $60_2$, wherein, in comparison with the MEMS sound transducer $20_3$, the backplates 12a and/or 12b are segmented. The insulation region 78a and/or 78k can be arranged nearer to the substrate 22 compared with FIG. 6a. Although the MEMS sound transducers $60_1$ and $60_2$ have been described such that both backplates 12a and 12b have the segmentation, it is also possible for just one of the backplates 12a or 12b or none of the backplates 12a and 12b to have the segmentation.

Figure 6C:
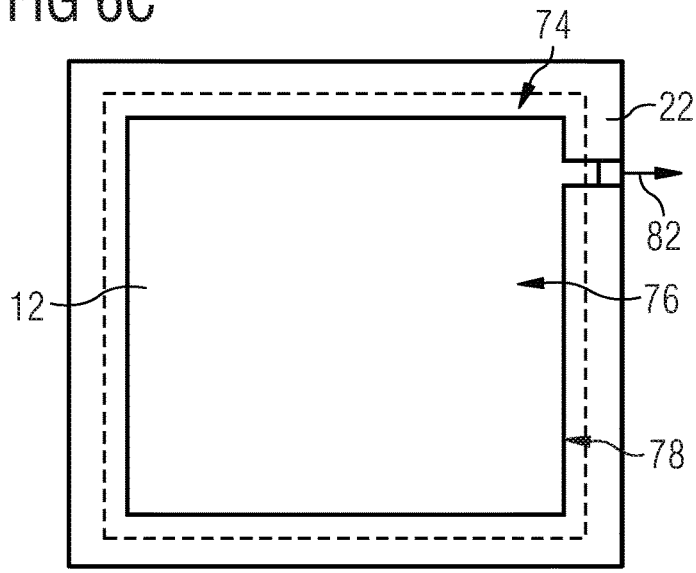
FIG. 6c a schematic plan view of a backplate which is formed in a polygonal fashion, for example, and which is segmented.

FIG. 6c shows a schematic plan view of a backplate 12 formed in a polygon-shaped fashion, for example, and segmented into the two regions 74 and 76 by the segmentation region 78. The segmentation region 78 thus forms a segmentation line extending almost fully circumferentially, wherein the region 76 is electrically contactable by means of an edge contacting 82. The option segmentation can also be embodied such that a higher number of segments or regions are obtained.

Figure 7:
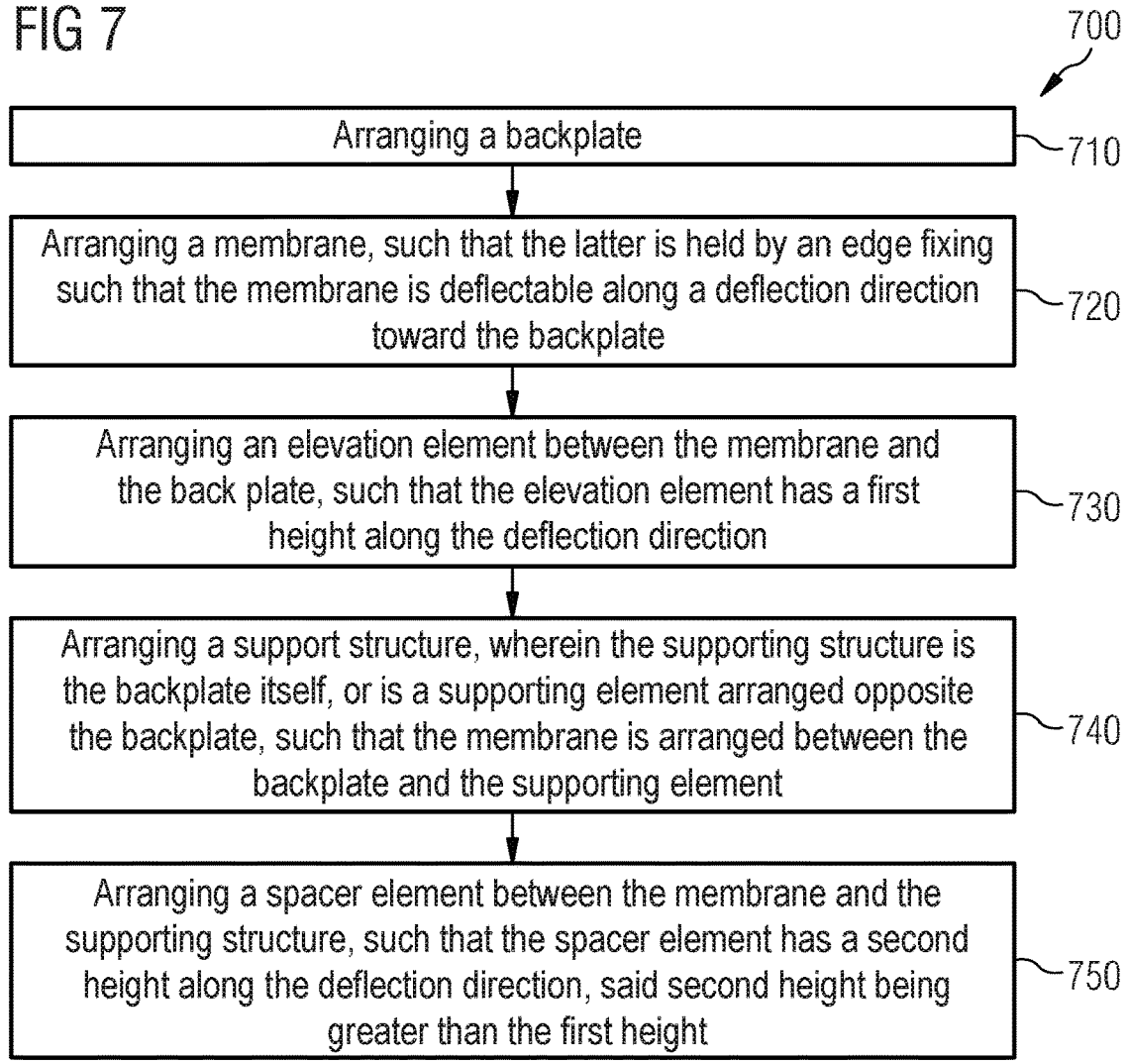
FIG. 7 shows a schematic flow diagram of a method for providing a MEMS sound transducer in accordance with one exemplary embodiment.

FIG. 7 shows a schematic flow diagram of a method 700 for providing a MEMS sound transducer in accordance with one exemplary embodiment. The method 700 comprises a step 710 involving arranging a backplate. A step 720 involves arranging a membrane, such that the latter is held by an edge fixing such that the membrane is deflectable along a deflection direction toward the backplate. A step 730 involves arranging an elevation element between the membrane and the backplate, such that the elevation element has a first height along the deflection direction. A step 740 involves arranging a supporting structure, wherein the supporting structure is the backplate itself, or is a supporting element arranged opposite the backplate, such that the membrane is arranged between the backplate and the supporting element. A step 56 involves arranging a spacer element between the membrane and the supporting structure, such that the spacer element has a second height along the deflection direction, said second height being greater than the first height.

One possible configuration of the method 700 is explained below with reference to FIGS. 8a to 8d. By way of example, a layer stack 80 can be provided, comprising a carrier substrate 62 covered by an insulation layer 64. By way of example, the carrier substrate 62 can be a silicon material and the insulation layer 64 can be a silicon nitride material and/or a silicon oxide material. The layer stack 80 furthermore comprises the backplate 12 covered by a sacrificial material 66. A layer thickness $h_x$ of the sacrificial layer can for example approximately correspond to the layer thickness of the backplate 12, which can be approximately 600 nm, and additionally approximately correspond to the gap to be set between the backplate 12 and the later membrane, which can be e.g. 1800 nm, such that the height $h_x$ can result as 2400 nm, this being a nonlimiting example. It goes without saying that other dimensions or other method steps such as additional deposition steps or removing steps such as grinding or etching can lead to other layer thicknesses.

Cutouts 68 having a depth or height $h_1$ can be arranged in the sacrificial material 66.

Figure 8A:
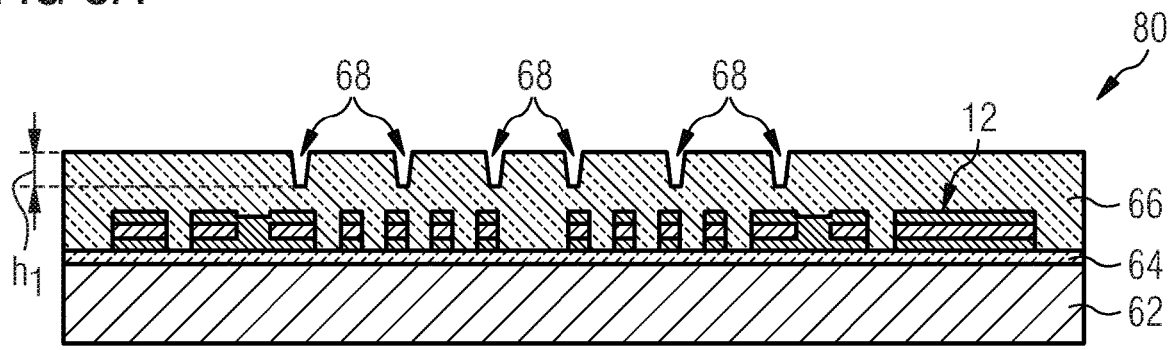
FIGS. 8a-8d show one possible configuration of the method from FIG. 6 in accordance with one exemplary embodiment.
Figure 8B:
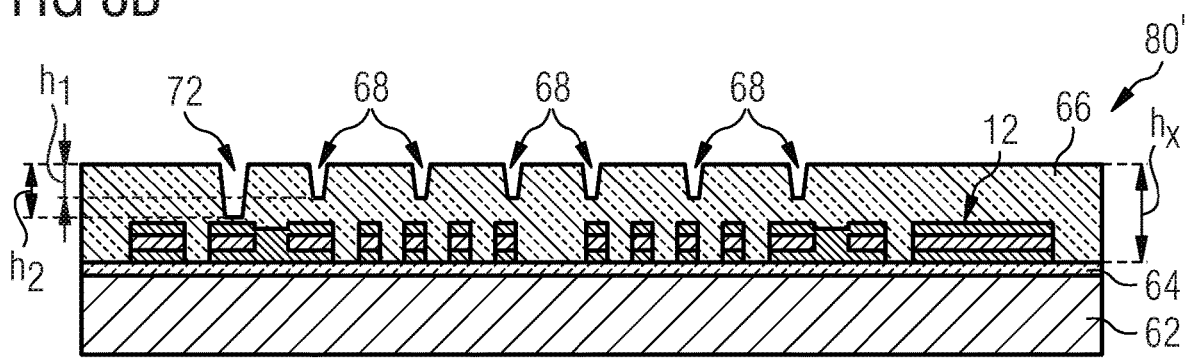

FIG. 8b shows a schematic lateral sectional view of a later stack 80', which can be obtained on the basis of the layer stack 80. The layer stack 80' furthermore has a cutout 72, which has the height $h_2$, and which serves for molding the spacer element. The cutouts 68 have the height $h_1$. The cutouts 68 and/or 72 can be obtained for example by means of a lithography step and/or selective etching.

Although the production of the cutouts 68 for the antisticking bumps and the production of the cutout 72 for the spacer element are illustrated as two mutually separate steps, the cutouts 68 and 72 can also be produced in a common step, for instance by means of a selective etching mask which enables earlier and therefore longer etching in the region of the cutout 72 compared with the region of the cutouts 68.

Figure 8C:
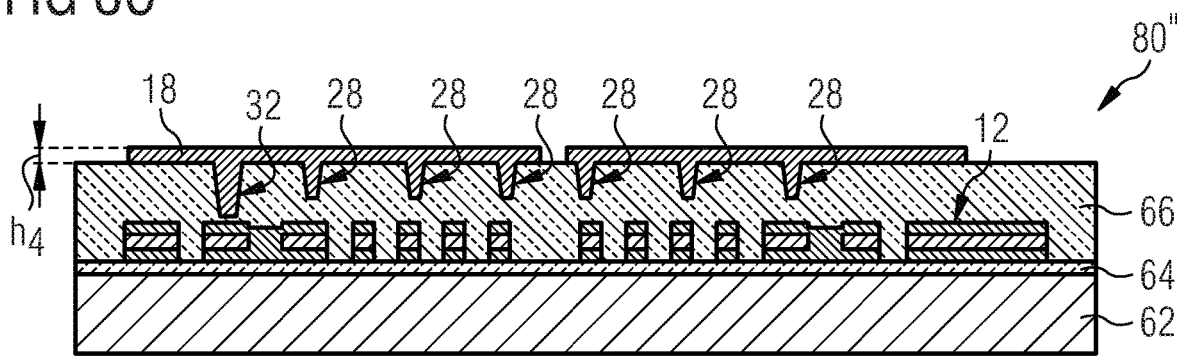

FIG. 8c shows a schematic lateral sectional view of a layer stack 80", which can be obtained for example by further processing of the layer stack 80'. By way of example, amorphous silicon or polysilicon can be arranged on the layer stack 80' in order to deposit the structure of the membrane 18. The membrane 18 can have for example a layer thickness ha of 350 nm to 1 µm, 400 nm to 600 nm or 430 nm to 470 nm, for instance 450 nm. At the same time, the cutouts 72 and 68 can be filled in order to obtain the elevation elements 28 and the spacer element 32.

Afterward, it is possible to deposit the further layers, for instance an additional sacrificial layer and possibly a further backplate thereon, and subsequently to remove the sacrificial material 66, such that the membrane 18 is movable relative to the backplate 12.

The cutouts 68 and 72 can be formed or etched for example with a tapering cross section in the direction of the backplate 12, such that the elevation elements 28 and/or the spacer element 32 can also have a configuration in which the cross-section changes along the orientation.

Figure 8D:
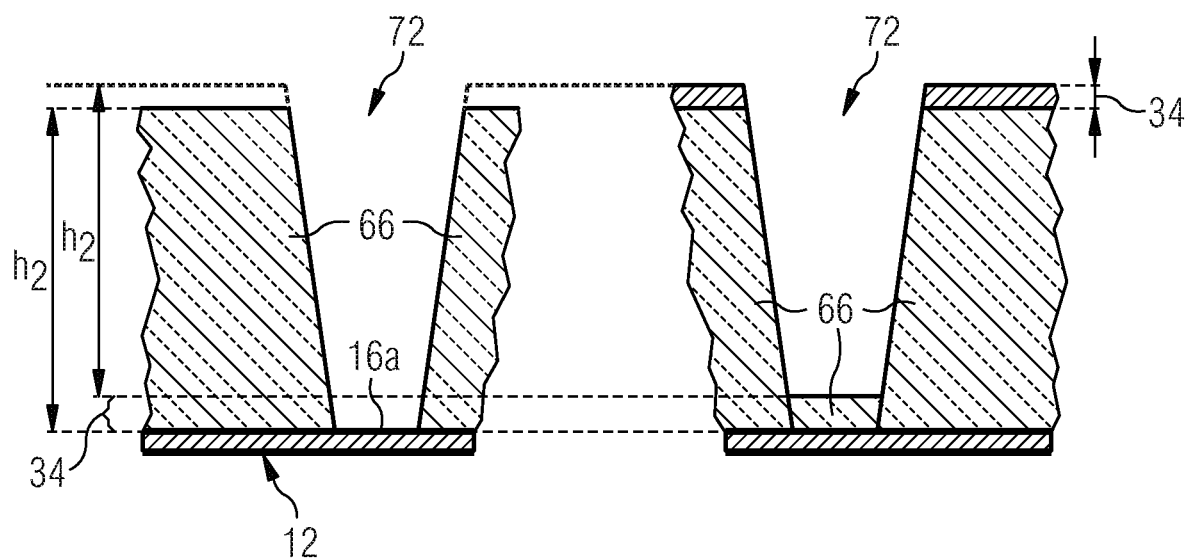

FIG. 8d shows a schematic lateral sectional view of the cutout 72 during a production method in accordance with one exemplary embodiment. In order to set the gap 34, $34_1$ or $34_2$ between the spacer element and the supporting structure, it is possible to shape the cutout 72 with a depth such that a remaining sacrificial material 66 in the layer stack 80 or 80' defines the gap. Alternatively, it is possible to shape the cutout 72 such that the sacrificial material is removed as far as the supporting structure, for instance the backplate 12. The insulation layer 16a of the backplate 12 can function as an etch stop layer, for example, such that a defined depth $h_2$ is settable for the formation of the trench. As is shown in the right-hand section of FIG. 8d, the sacrificial material 66 can subsequently be deposited in the cutout 72 and, if appropriate, over the entire wafer in order to save a lithography step, with the result that the gap 34 is exactly settable. In this case, the height $h_2$ can remain unchanged, since the sacrificial material can also be deposited in other, adjacent regions. Arranging the sacrificial material 66 can be implementable with a higher precision than an etching process for removing same, with the result that complete removal and subsequent arrangement enable a more exact definition of the gaps 34.

That means that, in accordance with FIGS. 8a-8c, the method comprises providing a layer stack having a first layer, which is the backplate or the supporting element, and having a second layer, which is a sacrificial layer. Furthermore, such a method comprises producing a cutout in the sacrificial layer, for instance the cutout 72, until the first layer, i.e. the supporting structure, is reached. Furthermore, the method comprises arranging the sacrificial material 66 in the cutout 72 with a sacrificial layer thickness which can correspond to the distance of the gaps 34. The method furthermore comprises arranging a membrane material, as was described in association with FIG. 8c. The membrane material is thus also arranged at the sacrificial layer and in the cutout 72. The method comprises removing the sacrificial layer, wherein a distance, the gap 34, between the membrane 18 and the first layer is obtained by removing the sacrificial material 66 in the cutout 72. Said distance corresponds to the sacrificial layer thickness, for example. Arranging the sacrificial material 66 in the cutout 72 can be carried out such that sacrificial material 66 is also arranged in the cutouts 68. Alternatively, the etching process here can also have a sufficient precision. Independently thereof, the cutouts 68 and 72 can be produced jointly and be produced such that the cutouts 68 have the height $h_1$ in the sacrificial layer and the cutout 72 has the height $h_2$ at least after the deposition of the sacrificial material.

Figure 9:
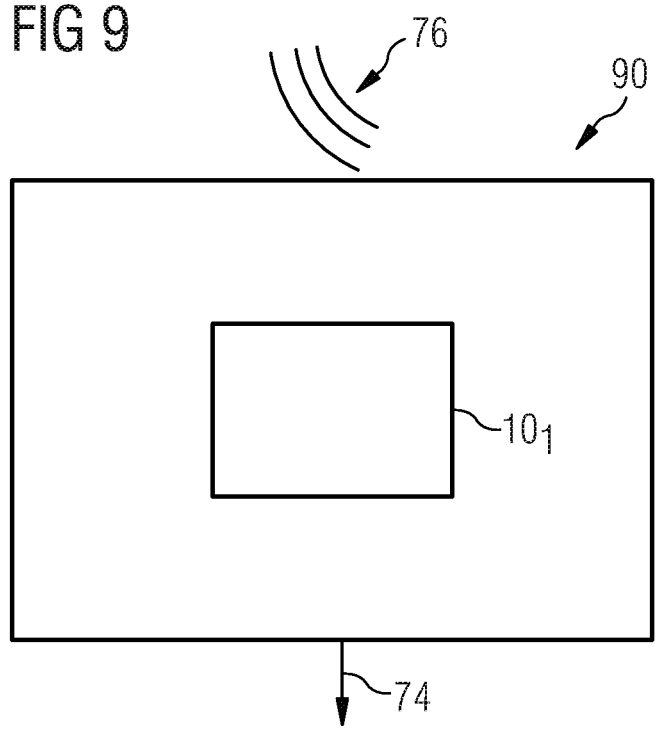
FIG. 9 shows a schematic block diagram of a MEMS microphone in accordance with one exemplary embodiment.

FIG. 9 shows a schematic block diagram of a MEMS microphone 90 in accordance with one exemplary embodiment. The MEMS microphone 90 comprises the MEMS sound transducer 10 and is configured to generate an electrical signal 74 on the basis of a sound wave 76 in a gaseous or liquid fluid, which sound wave reaches the MEMS sound transducer 10. As an alternative or in addition to the MEMS sound transducer $10_1$, at least one other sound transducer can be arranged, for instance the MEMS sound transducer $10_2$, $10_3$, $20_1$, $20_2$, $20_3$, 30 and/or 50.

The at least one spacer element 32 described makes it possible to remove the load on the TEOS mount, i.e. the substrate, and can be embodied at discrete locations and/or as a closed ring. Production as discrete elements may be simple compared with a closed ring.

The exemplary embodiments described enable MEMS sound transducers having a high robustness both in the preferred direction and in the opposite direction, by virtue of so-called support bumps, i.e. spacer elements, being used. The hotspots can thereby be converted into coldspots, that is to say that a low or no critical loading occurs.

In other words, a support bump can be realized as an additional bump relative to the anti-sticking bumps, which is formed for example after or with the cutouts in the sacrificial layer in order to form the bumps facing toward the bottom in the membrane. It is possible to etch as far as the region of the backplate and then to arrange a thin TEOS layer of 50 nm, for example. Said thin TEOS layer makes it possible to define the support gaps 34 before the bump material is filled therein. A plurality of support bumps can be arranged in a circular arrangement. As an alternative thereto, it is possible to arrange a closed ring. A width or a diameter of the support bumps can be small in order to prevent the bump from sticking to the membrane 18. The support bump can have a V-shape that corresponds to the trenches 72 in the layer stack 80' or 80". This enables a high quality of the later filling processes for filling the trench. That is to say that the cutout 72 can be produced in a V-shaped fashion, wherein the V-shape can be understood such that a trench can have a trench width that is variable with increasing trench depth, and/or the support bump, along the direction of extent parallel to the preferred direction, can have a variable extent perpendicular thereto. The support gap can be larger than a maximum deflection of the membrane during maximum operation, but can also be larger than the largest deflection in a narrow region, for instance in a region of at most 100 nm, at most 70 nm or at most 50 nm.

The support gap can become larger with increasing distance from the substrate since the membrane 18 has an increasing deflection.

In accordance with a first aspect, a MEMS sound transducer $10_1$; $10_2$; $10_3$; $20_1$; $20_2$; $20_3$; 30; $50_1$; $50_2$; $50_3$ can comprise the following features; a backplate 12; a membrane 18 held by an edge fixing such that the membrane 18 is deflectable along a deflection direction 26 toward the backplate 12; an elevation element 28 arranged between the membrane 18 and the backplate 12 and having a first height along the deflection direction 26; a supporting structure 12; 24; and a spacer element 32 arranged between the membrane 18 and the supporting structure 12; 24 and having a second height h2 along the deflection direction 26, said second height being greater than the first height; wherein the supporting structure 12; 24 is the backplate itself, or is a supporting element 24 arranged opposite the backplate 12, such that the membrane 18 is arranged between the backplate 12 and the supporting element 24.

In accordance with a second aspect referring to the first aspect, the MEMS sound transducer can comprise a preferred direction 36, along which the membrane 18 is deflectable preferably without damage compared with an opposite direction 38, wherein the spacer element 32 proceeding from the membrane 18 is arranged along the opposite direction 38.

In accordance with a third aspect referring to the first aspect, the substrate 22 can be configured to hold the membrane 18 in an edge region 44 of the membrane 18 at a first main side $44_2$ and an opposite second main side $44_1$, wherein the first main side $44_2$ is covered by the substrate 22 to a smaller extent than the second main side $44_1$; and wherein the supporting structure 12b is arranged in a manner facing the first main side $44_2$.

In accordance with a fourth aspect referring to the first aspect, the membrane 18 can be configured to deform around the spacer element 32 during the mechanical overload, such that a mechanical load which is taken up by the spacer element 32 as a result of the deformation, a mechanical loading of the membrane 18 in a region of a substrate suspension of the membrane 18 is reduced.

In accordance with a fifth aspect referring to the first aspect, the backplate 12 can be a first backplate 12a, the elevation element 28 can be a first elevation element 28a-b, and the supporting structure can be the supporting element 24; wherein the supporting element 24 is formed as a second backplate 12b of the MEMS sound transducer, wherein a second elevation element 28c-d is arranged between the membrane 18 and the second backplate 12b.

In accordance with a sixth aspect referring to the first aspect, the spacer element 32 can be arranged at the membrane 18 and can be arranged in a manner facing the supporting structure 12; 24; or the spacer element 32 can be arranged at the backplate 12 and can be arranged in a manner facing the membrane 18.

In accordance with a seventh aspect referring to the first aspect, the spacer element 32 can be arranged at a distance 48 of at most 80 μm from the edge fixing $42_2$ of the membrane 18.

In accordance with an eighth aspect referring to the first aspect, the spacer element 32 can have a dimension $h_2$ along the deflection direction 26 in a range of at least 800 nm and at most 3000 nm.

In accordance with a ninth aspect referring to the first aspect, the spacer element 32 can have a dimension d along a direction perpendicular to the deflection direction 26 in a range of 0.5 μm to 1.5 μm.

In accordance with a tenth aspect referring to the first aspect, the spacer element 32 can be arranged at the membrane 18 and can be at a distance 34 from the supporting structure in a rest state of the MEMS sound transducer, or the spacer element 32 can be arranged at the supporting structure 12; 24 and can be at the distance 34 from the membrane in the rest state, wherein the distance 34 has a value in a range of at least 20 nm and at most 80 nm.

In accordance with an eleventh aspect referring to the first aspect, the spacer element 32 can be formed in a V-shaped fashion.

In accordance with a twelfth aspect referring to the first aspect, the backplate 12a, 12b can have a segmentation 78, which provides an electrical insulation between at least two partial regions 74a, 76a; 74b, 76b of the backplate 12a, 12b.

In accordance with a thirteenth aspect, it is possible to form a MEMS sound transducer $10_1$; $10_2$; $10_3$; $20_1$; $20_2$; $20_3$; 30; $50_1$; $50_2$; $50_3$; $50_4$; $60_1$; $60_2$, comprising a backplate 12, comprising a membrane 18 held by an edge fixing such that the membrane 18 is deflectable along a deflection direction 26 toward the backplate 12, comprising a supporting structure 12; 24, which is at a distance from the membrane during a rest position of the MEMS sound transducer; and comprising a spacer element 32 arranged between the membrane 18 and the supporting structure 12; 24. The spacer element 32 is arranged in an outer region of the membrane 18. The spacer element 32 can have a height along the deflection direction 26, such that, at the location of the spacer element 32 and in the rest position, a gap 34 between the membrane 18 and the spacer element 32 is at most 20% of a distance between the supporting structure and the membrane 18.

In accordance with a fourteenth aspect referring to the thirteenth aspect, the height in the rest position can be greater than a membrane-global minimum distance between the membrane 18 and the supporting structure 12; 24 during disturbance-free operation of the MEMS sound transducer.

In accordance with a fifteenth aspect referring to the thirteenth aspect, the supporting element 24 can be at a distance of at most 20 nm from the membrane during disturbance-free operation of the MEMS sound transducer.

In accordance with a sixteenth aspect referring to the thirteenth aspect, the height can be configured such that, during disturbance-free operation, the gap is larger than the deflection of the membrane along the deflection direction 26 at the location of the spacer element 32.

A seventeenth aspect can comprise a MEMS microphone 90 comprising a MEMS sound transducer in accordance with the first aspect.

In accordance with an eighteenth aspect, a method 700 for providing a MEMS sound transducer can comprise the following steps: arranging 710 a backplate; arranging 720 a membrane, such that the latter is held by an edge fixing such that the membrane is deflectable along a deflection direction toward the backplate; arranging 730 an elevation elements between the membrane and the backplate, such that the elevation element has a first height along the deflection direction; arranging 740 a supporting structure; and arranging 750 a spacer element between the membrane and the supporting structure, such that the spacer element has a second height along the deflection direction, said second height being greater than the first height; wherein the supporting structure is the backplate itself, or is a supporting element arranged opposite the backplate, such that the membrane is arranged between the backplate and the supporting element.

In accordance with a nineteenth aspect referring to the eighteenth aspect, arranging the spacer element can comprise the following steps: providing a layer stack 80 having a first layer, which is the backplate 12 or the supporting element 24, and having a second layer, which is a sacrificial layer 66; producing a cutout 72 in the sacrificial layer 66 until the first layer is reached; arranging a sacrificial material 66 in the cutout 72, having a sacrificial layer thickness 34; arranging a membrane material 18, at the sacrificial layer 66 and in the cutout 72; removing the sacrificial layer 66, wherein as a result of removing the sacrificial material 66 in the cutout 72 a distance corresponding to the sacrificial layer thickness is obtained between the membrane 18 and the first layer.

In accordance with a twentieth aspect referring to the nineteenth aspect, the cutout 72 can be a first cutout, and the method can comprise the following step: producing a second cutout 68 in the sacrificial layer 66 together with the first cutout 72, such that the second cutout 68 has the first height $h_1$ in the sacrificial layer 66, wherein the first cutout 72 has the second height $h_2$ after the deposition of the sacrificial material 66.

Although some aspects have been described in association with a device, it goes without saying that these aspects also constitute a description of the corresponding method, such that a block or a component of a device should also be understood as a corresponding method step or as a feature of a method step. Analogously thereto, aspects that have been described in association with or as a method step also constitute a description of a corresponding block or detail or feature of a corresponding device.

The exemplary embodiments described above merely constitute an illustration of the principles of the present invention. It goes without saying that modifications and variations of the arrangements and details described will become apparent to others skilled in the art. Therefore, the intention is for the invention to be restricted only by the scope of protection of the patent claims hereinafter, and not by the specific details that have been presented on the basis of the description and the explanation of the exemplary embodiments.

What is claimed is:

1. A MEMS sound transducer, comprising:
a backplate;
a membrane held by an edge fixing such that the membrane is deflectable along a deflection direction toward the backplate;
an elevation element arranged between the membrane and the backplate and having a first height along the deflection direction; and
a spacer element arranged between the membrane and the backplate and having a second height along the deflection direction, the second height being greater than the first height,
wherein the elevation element and the spacer element are both arranged at the backplate in a manner facing the membrane,
wherein:
the spacer element is arranged at a distance of at least 1 µm and at most 80 µm from the edge fixing of the membrane; and/or
the spacer element has a dimension along the deflection direction in a range of at least 800 nm and at most 3000 nm; and/or
the spacer element has a dimension along a direction perpendicular to the deflection direction in a range of 0.5 µm to 1.5 µm; and/or
the spacer element is at a distance in a range of at least 20 nm and at most 300 nm from the membrane in a rest state of the MEMS sound transducer.

2. The MEMS sound transducer of claim 1, further comprising a substrate configured to hold the membrane in an edge region of the membrane at a first main side and an opposite second main side.

3. The MEMS sound transducer of claim 1, wherein the membrane is configured to deform around the spacer element during a mechanical overload, such that a mechanical load is taken up by the spacer element as a result of the deformation and a mechanical loading of the membrane in a region of a substrate suspension of the membrane is reduced.

4. The MEMS sound transducer of claim 1, wherein the spacer element is formed in a V-shaped fashion.

5. The MEMS sound transducer of claim 1, wherein the backplate has a segmentation which provides an electrical insulation between at least two partial regions of the backplate.

6. A MEMS microphone comprising the MEMS sound transducer of claim 1.

7. A MEMS sound transducer, comprising:
a backplate;
a membrane held by an edge fixing such that the membrane is deflectable along a deflection direction toward the backplate;
a supporting structure which is at a distance from the membrane during a rest position of the MEMS sound transducer; and a spacer element arranged between the membrane and the supporting structure, wherein the spacer element is arranged in an outer region of the membrane, wherein the spacer element has a height along the deflection direction, such that, at the location of the spacer element and in the rest position, a gap between the membrane and the spacer element is at most 20% of a distance between the supporting structure and the membrane.

8. The MEMS sound transducer of claim 7, wherein the height in the rest position is greater than a membrane-global minimum distance between the membrane and the supporting structure during disturbance-free operation of the MEMS sound transducer.

9. The MEMS sound transducer of claim 7, wherein the supporting element is at a distance of at most 20 nm from the membrane during disturbance-free operation of the MEMS sound transducer.

10. The MEMS sound transducer of claim 7, wherein the height is configured such that, during disturbance-free operation, the gap is larger than the deflection of the membrane along the deflection direction at the location of the spacer element.

11. A MEMS microphone comprising the MEMS sound transducer of claim 7.

12. A method for manufacturing a MEMS sound transducer, the method comprising:
arranging a backplate;
arranging a membrane such that the membrane is held by an edge fixing and the membrane is deflectable along a deflection direction toward the backplate;
arranging an elevation element between the membrane and the backplate, such that the elevation element has a first height along the deflection direction;
arranging a supporting structure; and
arranging a spacer element between the membrane and the supporting structure, such that the spacer element has a second height along the deflection direction, the second height being greater than the first height,
wherein the supporting structure is the backplate or is a supporting element arranged opposite the backplate, such that the membrane is arranged between the backplate and the supporting element,
wherein arranging the spacer element comprises:
providing a layer stack having a first layer, which is the backplate or the supporting element, and having a second layer, which is a sacrificial layer;
producing a cutout in the sacrificial layer until the first layer is reached;
arranging a sacrificial material in the cutout and having a sacrificial layer thickness;
arranging a membrane material at the sacrificial layer and in the cutout;
removing the sacrificial layer in the cutout such that a distance corresponding to the sacrificial layer thickness is obtained between the membrane and the first layer.

13. The method of claim 12, wherein the cutout is a first cutout and the method further comprises:
producing a second cutout in the sacrificial layer together with the first cutout, such that the second cutout has the first height in the sacrificial layer and the first cutout has the second height after deposition of the sacrificial material.

* * * * *